United States Patent
Huang

(10) Patent No.: US 10,910,051 B1
(45) Date of Patent: Feb. 2, 2021

(54) METHOD AND ELECTRONIC CIRCUIT FOR VERIFYING OPERATION PERFORMED BY CELL OF RRAM

(71) Applicant: Winbond Electronics Corp., Taichung (TW)

(72) Inventor: Koying Huang, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/686,196

(22) Filed: Nov. 17, 2019

(51) Int. Cl.
  *G11C 11/00* (2006.01)
  *G11C 13/00* (2006.01)
  *G01R 27/26* (2006.01)
  *G01R 27/14* (2006.01)

(52) U.S. Cl.
  CPC .......... *G11C 13/0064* (2013.01); *G01R 27/14* (2013.01); *G01R 27/2605* (2013.01); *G11C 13/0069* (2013.01); *G11C 2013/0066* (2013.01)

(58) Field of Classification Search
  CPC ............ G11C 13/0064; G11C 13/0069; G11C 2013/0066; G01R 27/14; G01R 27/2605
  USPC ....................................................... 365/148
  See application file for complete search history.

(56) References Cited

U.S. PATENT DOCUMENTS

| 9,208,875 B2 | 12/2015 | Lee et al. |
| 2007/0115714 A1* | 5/2007 | Muraoka ............. G11C 11/5685 365/148 |

FOREIGN PATENT DOCUMENTS

| TW | I449050 | 8/2014 |
| TW | I642057 | 11/2018 |
| TW | 201907402 | 2/2019 |

OTHER PUBLICATIONS

"Office Action of Taiwan Counterpart Application", dated May 27, 2020, p. 1-p. 6.

\* cited by examiner

*Primary Examiner* — Huan Hoang
(74) *Attorney, Agent, or Firm* — JCIPRNET

(57) ABSTRACT

The disclosure is directed to a method and an apparatus for verifying an operation performed by a cell of a RRAM. In an aspect of the disclosure, the method of verifying an operation performed by a cell of a RRAM would include not limited to performing a first write operation by applying a first write voltage on a cell of the RRAM; measuring a first resistance and a first rate of change of the resistance of the cell; detecting whether the first rate of change of the resistance is below a negative change of resistance threshold; detecting whether the first resistance is below a target resistance value in response to having detected that the first rate of change of the resistance is below the negative change of resistance threshold; and having determined the cell is valid in response to having detected the first resistance dropping below the target resistance value.

20 Claims, 8 Drawing Sheets

METHOD AND ELECTRONIC CIRCUIT FOR VERIFYING OPERATION PERFORMED BY CELL OF RRAM

TECHNICAL FIELD

The disclosure is directed to a method and an electronic circuit for verifying an operation performed by a cell of a resistive random access memory (RRAM).

BACKGROUND

One conventional method to test a write operation on a cell of a RRAM chip is to detect the resistance value of a cell and subsequently compare the detected resistance value with a predetermined target value. If during a write operation the detected resistance value has reached the target value, then the write operation is considered a success. However, if the detected resistance value has not reached the target value, then the write operation could have failed or not yet finished. If write operation has not yet finished, then the write operation should be allowed to continue. If the write operation has been failure, then the previous write operation would be reversed to allow a re-write on the same cell. If the detected resistance does not reach the target value after a write operation is complete, the failure to reach the target value could be due to an overwrite. In that case, the previous write operation would be reversed and the same cell would be re-written again.

FIG. 1A illustrates a hypothetical scenario of applying a conventional testing method to test a RRAM chip. At a first verify point 101, the detected resistance value might not have changed since the write operation has not yet finished, and thus the write operation would be allowed to continue. At a second verify point 102, the detected resistance value has already been reached and surpassed the target value 111 and thus the write operation is considered a success. However, alternatively, if the resistance value were to reach and surpass the target value 111 but at a third verify point 103 the resistance value was detected to have failed to reach the target value 111, then it is uncertain whether the write operation is not yet complete and should be allowed to continue or the previous write operation should be reversed for a subsequent re-write.

FIG. 1B illustrates another hypothetical scenario of applying a conventional testing method to test a RRAM chip. In such scenario, at a fourth verify point 104, the detected resistance value 105 has never reached the target value 111, but it is difficult to determine whether the write operation has actually failed since the resistance value is detected on a time point by time point basis, and at each time point, the conventional testing method would acquire one detected resistance value.

Based on the hypothetical scenario of FIG. 1A and FIG. 1B, it can be seen that if the testing method would only compare the detected resistance value of a cell with the predetermined target value, then it would be difficult to know if an overwrite has occurred. Even though the conventional testing method may resolve some issues, the conventional testing method nevertheless could not detect that some cells never reach target value 111. Therefore, a more sophisticated method of testing a RRAM could be needed.

SUMMARY OF THE DISCLOSURE

The disclosure is directed to a method and an electronic circuit for verifying an operation performed by a cell of a RRAM.

In an aspect, the disclosure is directed to a method of verifying an operation of a RRAM. The method would include not limited to: performing a first write operation by applying a first write voltage on a cell of the RRAM; measuring a first resistance and a first rate of change of the resistance of the cell; detecting whether the first rate of change of the resistance is below a negative change of resistance threshold; detecting whether the first resistance is below a target resistance value in response to having detected that the first rate of change of the resistance is below the negative change of resistance threshold; and having determined the cell is valid in response to having detected the first resistance dropping below the target resistance value.

In an aspect, the disclosure is directed to an electronic circuit which would include not limited to: a controller circuit configured to: perform a first write operation by applying a first write voltage on a cell of the RRAM; measure a first resistance and a first rate of change of the resistance of the cell; detect whether the first rate of change of the resistance has decreased below a negative change of resistance threshold; detect whether the first resistance is below a target resistance value in response to having detected that the first rate of change of the resistance is below the negative change of resistance threshold; and have determined that the cell is valid in response to having detected the first resistance dropping below the target resistance value.

In order to make the aforementioned features and advantages of the disclosure comprehensible, exemplary embodiments accompanied with figures are described in detail below.

DETAILED DESCRIPTION OF DISCLOSED EMBODIMENTS

Figure 1A:
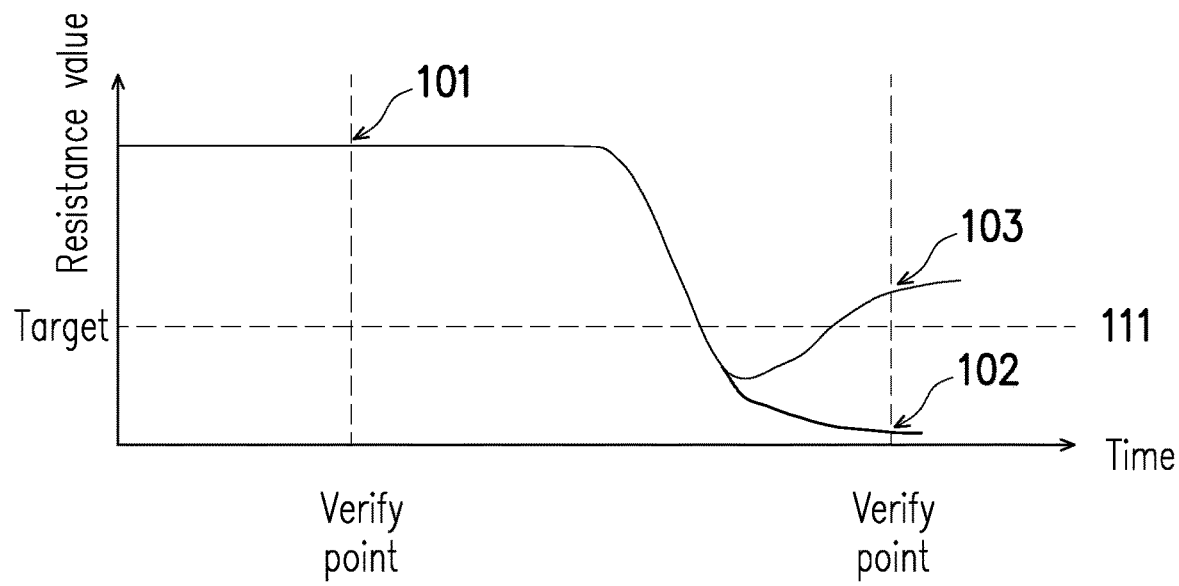
FIG. 1A illustrates a hypothetical scenario of applying a conventional verifying method to verify a write operation of a RRAM chip.
Figure 1B:
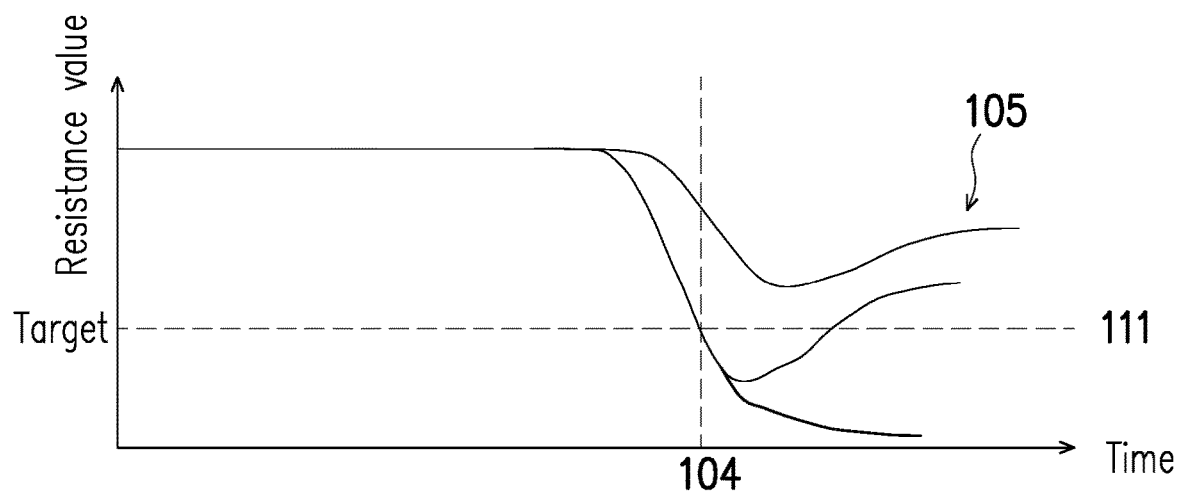
FIG. 1B illustrates another hypothetical scenario of applying a conventional verifying method to verify a write operation of a RRAM chip.

Reference will now be made in detail to the present exemplary embodiments of the disclosure, examples of which are illustrated in the accompanying drawings. Wherever possible, the same reference numbers are used in the drawings and the description to refer to the same or like parts.

Figure 2:
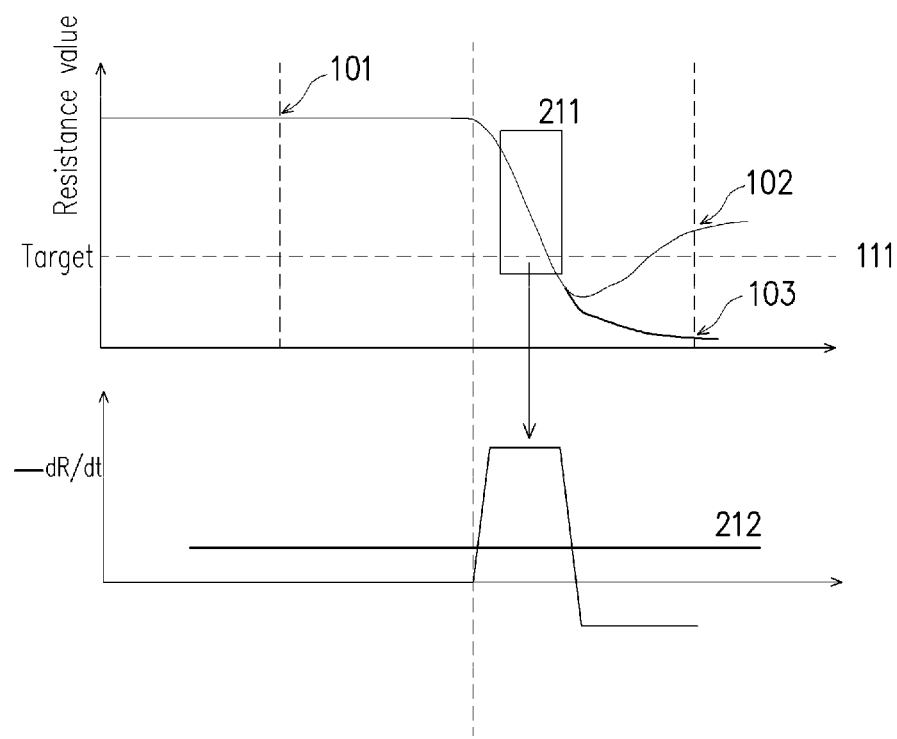
FIG. 2 illustrates applying a verifying method to verifying a write operation of a RRAM chip in accordance with one of the exemplary embodiments of the disclosure.

As described previously, for a conventional method of verifying a cell of a RRAM, resistance values are measured at specific verifying time points. At third verifying time point 103, as seen in FIG. 2, the measured resistance value has dropped below the target resistance value 111 and thus the write operation would be deemed successful. However, alternatively, assuming that the resistance value of the cell has previously reached the target resistance value 111 but has gone back above the target resistance value 111, then the measured resistance value at the second time point 102 could false indicate that the write operation was not successful. Thus, the disclosure resolves the above describe problem by introducing a mechanism and a circuit to more accurately detect whether the resistance of a cell of a RRAM has reached the target resistance value 111.

In order to more accurately test a RRAM, the disclosure provides a method and an apparatus to test the RRAM on a per cell basis. The disclosure tests the RRAM based on determining the rate of change $$\left(\frac{dR}{dT}\right)$$

of a resistance of a cell of the RRAM during a write process and combining it with an original testing method. The write operation could be automatically stopped as being deemed complete after having detected the rate of change in order to prevent the overwrite from occurring so as to reduce writing time. The resistance value could be measured after a specific change pattern of the resistance value has been detected. Upon the measurement after the specific change pattern has been detected, a cell could be determined as valid if the resistance value of the cell has reached a target resistance value. If the resistance of the cell has not reached the target resistance value after specific change pattern has been detected, then the write voltage could be reversed in order to be perform another iteration of the write operation.

The above described specific change pattern is further explained in view of FIG. 2. During the period 211 when the resistance value of the cell is decreasing, the method and apparatus of the disclosure would provide a mechanism to measure the rate of change of the resistance of a cell. As seen in FIG. 2, as the resistance is dropping, the (−dR/dT) would reflect a corresponding increase of the negative rate of change of the resistance of the cell. As the resistance value of the cell is decreasing, the (−dR/dT) of the cell would start to increase. When (−dR/dT) has exceeded a negative change of resistance threshold 212, whether the resistance of the cell is below the target resistance value 111 is determined. If the resistance of the cell is below the target resistance value 111, then the write operation is deemed successful and complete. Otherwise, if the resistance of the cell is above the target resistance value 111, then the write operation is deemed to have failed, and a reverse of the write voltage would be applied in order to repeat the same write operation.

Figure 3A:
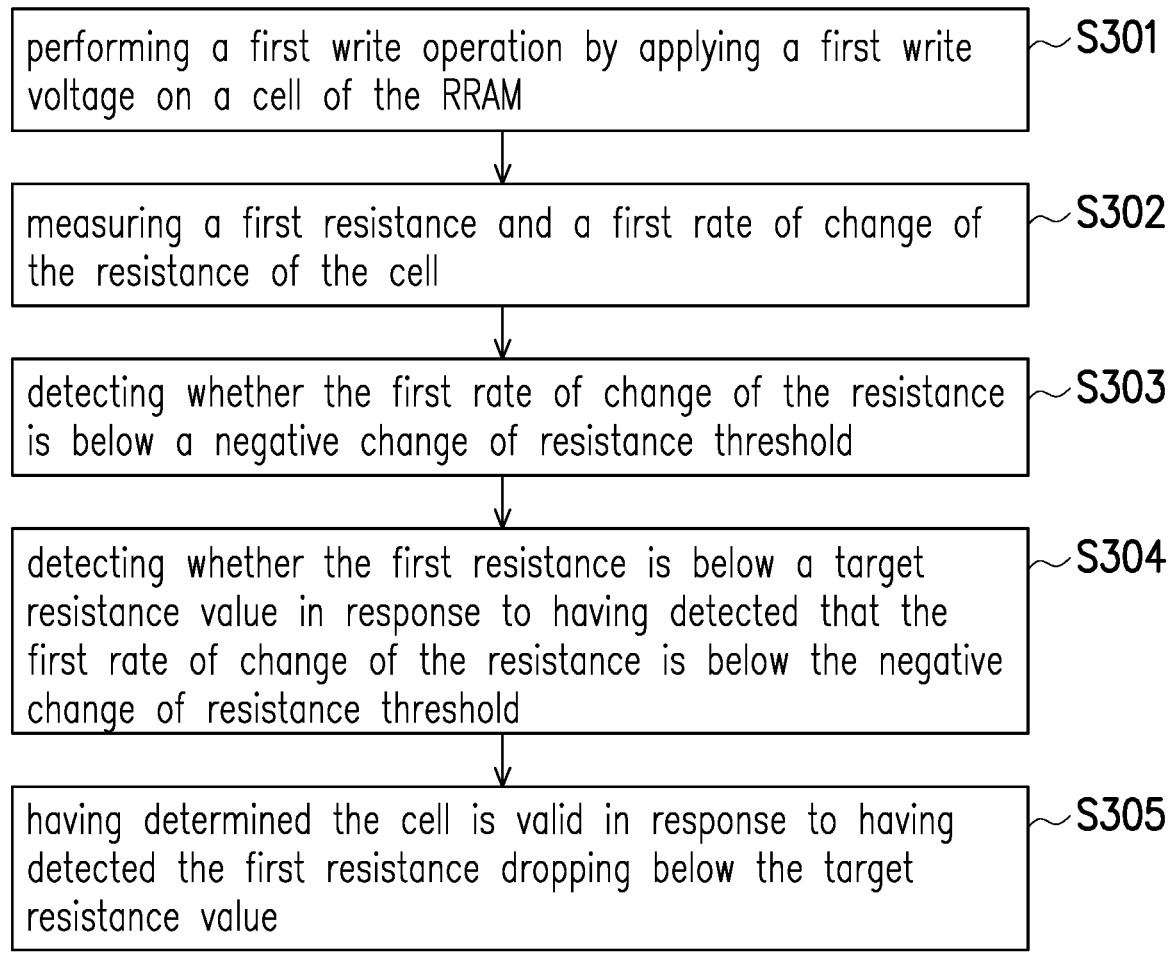
FIG. 3A is a flow chart which illustrates a method of testing a RRAM in accordance with one of the exemplary embodiments of the disclosure.
Figure 3B:
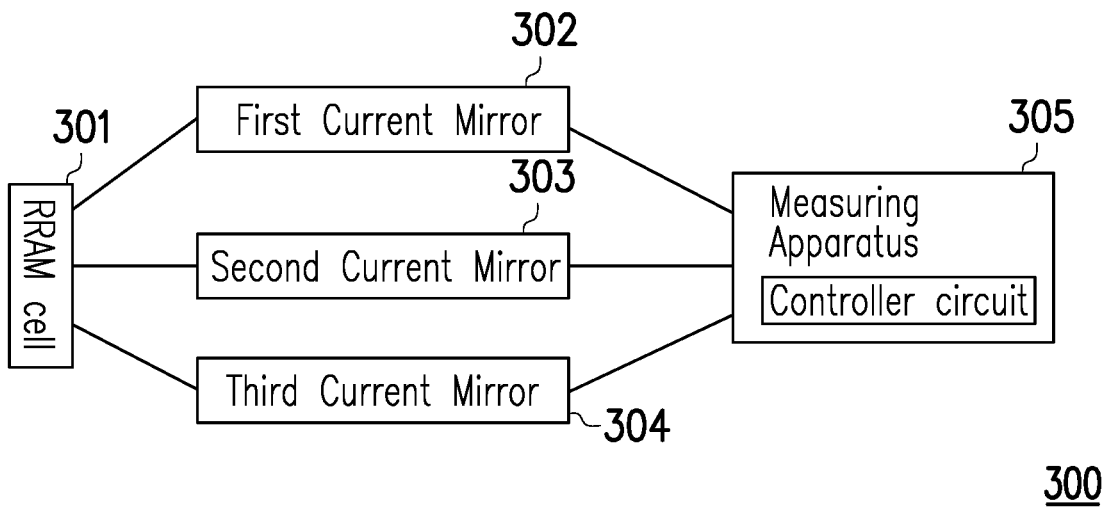
FIG. 3B illustrates an electronic circuit for testing a RRAM in accordance with one of the exemplary embodiments of the disclosure.

FIG. 3A and FIG. 3B respectively describe the method and apparatus for verifying an operation performed by a cell of a RRAM. Refers to FIG. 3A, in step S301, a a RRAM would perform a first write operation by applying a first write voltage on a cell. In step S302, the RRAM would measure a first resistance of the cell and a first rate of change of the resistance of the cell. In step S303, the RRAM would detect whether the first rate of change of the resistance is below a negative change of resistance threshold (e.g. 212). In step S304, the RRAM would detect whether the first resistance is below a target resistance value. In step S305, the cell is determined as valid in response to having detected that the first resistance has dropped below the target resistance value.

According to one of the exemplary embodiments, the cell could be considered as invalid in response to not having detected the second resistance dropping below the target resistance value. When such circumstance has occurred, the RRAM may apply a second write voltage which is a reverse of the first write voltage (e.g. 3 volts become −3 volts) on the cell and subsequent perform another iteration of the same write operation.

According to one of the exemplary embodiments, when the rate of change of the resistance of the cell at the first time point has been detected, the write operation could be stopped in order to avoid overwriting and to reduce writing time.

According to one of the exemplary embodiments, applying the bias voltage across the cell of the RRAM may include applying a first bias voltage to the cell of the RRAM, detecting whether a write current drawn by the cell of the RRAM has changed, and increasing the first bias voltage to a second bias voltage in response to not detecting the write current of the cell having changed.

According to one of the exemplary embodiments, measuring the first resistance of the cell and the rate of change of the resistance of the cell at a first time point could be performed by applying the first write voltage to detect a write current and a rate of change of the write current and derive the resistance and the rate of change of the resistance of the cell according to a ratio between the write voltage across the cell and the write current across the cell over time.

According to one of the exemplary embodiments, wherein measuring the rate of change is performed by a first current mirror circuit which is connected to a first resistor-capacitor (RC) filter having a first delay. Measuring the rate of change may include detecting a first output current of the first current mirror. If the first output current increases, then the rate of change is positive; whereas if the first output current decreases, then the rate of change is negative.

According to one of the exemplary embodiments, detecting the rate of change is performed by a second current mirror circuit which is connected to a second resistor-capacitor (RC) filter having a second delay which has a larger capacitive value for a longer delay than the first delay.

According to one of the exemplary embodiments, detecting the first resistance of the cell and detecting the second resistance of the cell are performed by measuring a second output current of a third current mirror circuit which is connected to the cell of the RRAM.

Refer to FIG. 3B, the apparatus 300 would include not limited to a RRAM cell 301, a first current mirror circuit 302, a second current mirror circuit 303, a third current mirror circuit 304, and a measuring apparatus which as a controller circuit 305. The RRAM cell 301 is the subject under test. The first current mirror circuit 302 and the second current mirror circuit 303 could be optional elements that are used for measuring the rate of change of the resistance of the RRAM cell 301. The third current mirror circuit 303 is used for measuring the resistance of the RRAM cell 301. The measuring apparatus may include one or more test equipment which could be automated and controlled by the controller circuit 305. The controller circuit 305 could be programmed or designed to implement the steps and exemplary embodiments shown in FIG. 2. The controller circuit 305 could be implemented by using programmable units such as a micro-processor, a micro-controller, a DSP chips, FPGA, etc. The functions of the controller circuit 305 may also be implemented with separate electronic devices or ICs. The details regarding the principle of operations of FIG. 2, FIG. 3A and FIG. 3B will be expanded upon in latter parts of the disclosure.

Figure 4:
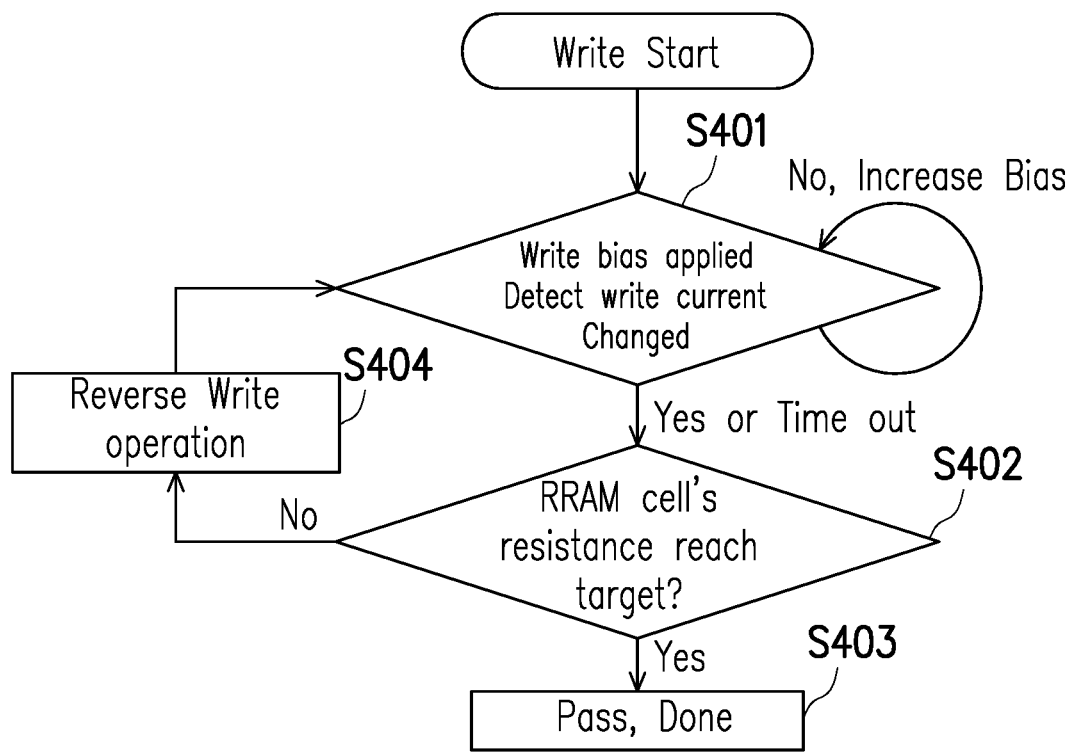
FIG. 4 is a flow chart which illustrates a method of testing a RRAM in accordance with a first exemplary embodiments of the disclosure.
Figure 5:
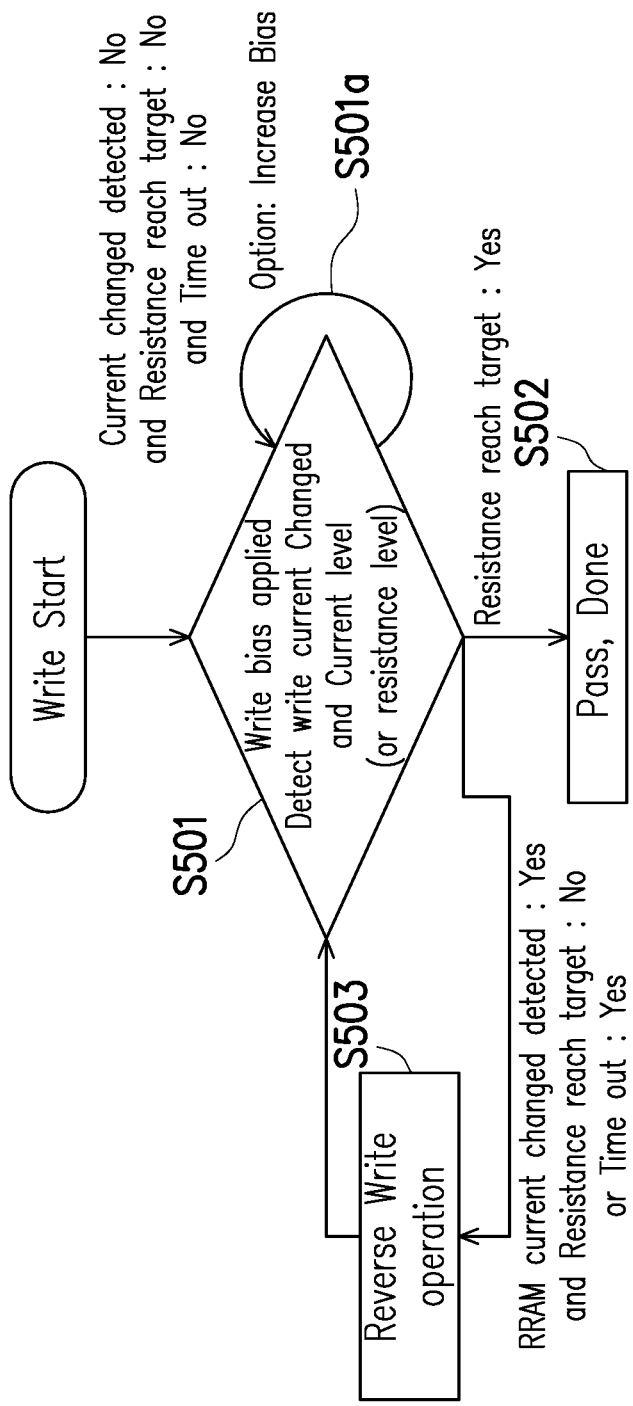
FIG. 5 is a flow chart which illustrates a method of testing a RRAM in accordance with a second exemplary embodiment of the disclosure.

FIG. 4 and FIG. 5 describe two exemplary embodiments of the method of verifying an operation of a cell of a RRAM. Refer to FIG. 4, in step S401, a write operation will be performed on a cell of the RRAM by applying a first bias voltage across the cell of the RRAM to detect whether a write current which is drawn from the RRAM has changed. If so, step S402 will be performed. If the write current drawn from the RRAM has not been changed, then the write bias voltage could be increased to a second bias voltage so as to determine whether the write current has changed. The process of changing the write bias voltage could be repeated until the write current has changed or a second predetermined period has expired from the beginning of step S401. If the write current has changed or if the predetermined period has expired, then step S402 will be performed to determine whether the cell is deemed valid by reaching a target resistance value (e.g. 111). Step S402 is the same as step S501 and will be explained in the next embodiment. If the resistance of the RRAM has never reached the target resistance value as determined by step S501, then in step S404, the RRAM will applying a reverse of the write bias voltage in order to restart the write operation. If the resistance of the RRAM has never reached the target resistance value as determined by step S501, then in step S403, the cell is determined to be valid.

Refer to FIG. 5, before step S501, it is assumed that the step S401 has been performed and either the write current has changed or the second predetermined period has expired. Then in step S501, a first resistance of the cell and a rate of change of the resistance of the cell would be measured. The first resistance of the cell and the rate of change could be simultaneously measured at a first time point. In response to having detected the rate of change, then a second resistance of the RRAM would be measured. Also when the rate of change of the resistance has been detected, the write operation would be stopped in order to avoid overwrite and to save writing time. In response to having determined that the second resistance has dropped below a target resistance value (e.g. 111), then in step S502, the write operation is complete and the cell is determined as valid. However, if the second resistance has never dropped below the target resistance value within the first predetermined period, then the current write operation would be reversed and step S501 will be repeated by starting another write operation to detect the resistance of the cell. If after a certain number of failures, the cell could be considered as invalid and the write operation could be stopped.

Figure 6:
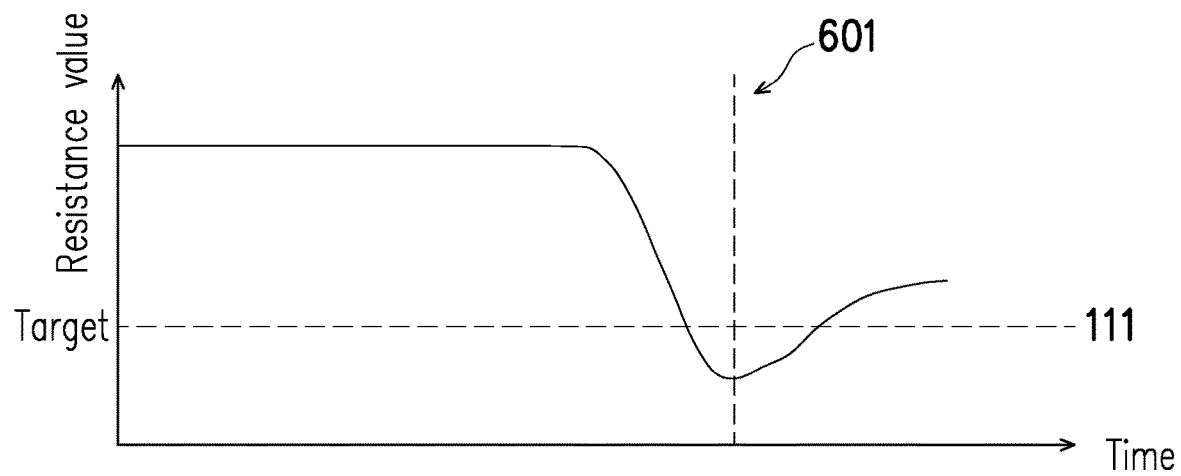
FIG. 6 illustrates a hypothetical scenario of detecting resistance value change by using the method of testing a RRAM in accordance with a first exemplary embodiments of the disclosure.
Figure 7:
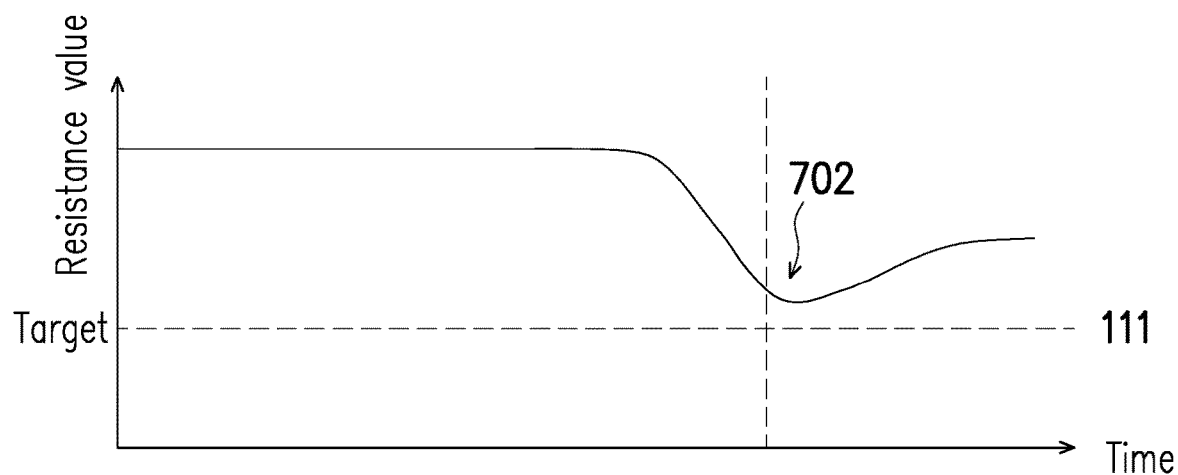
FIG. 7 illustrates another hypothetical scenario of detecting resistance value change by using the method of testing a RRAM in accordance with a first exemplary embodiments of the disclosure.

FIG. 6 and FIG. 7 respectively illustrate the hypothetical scenarios of the cell passing the test and failing the test. Referring to FIG. 6, a resistance value is measured after the rate of change of the resistance value has previously been detected. At a verify time point 601, if the resistance value of the cell has been determined to drop below a target resistance value, then the cell has passed the test. The write operation will be stopped to avoid the subsequent overwrite. Referring to FIG. 7, a resistance value is measured after the rate of change of the resistance value has previously been detected. At a verify time point 702, if the resistance value of the cell has been determined to fail drop below a target resistance value within a first predetermined period, then the cell has failed the test. The current write operation will then be reverse and another iteration of the write operation and measurement of the resistance value and rate of change of the resistance value of the cell will be performed.

Figure 8:
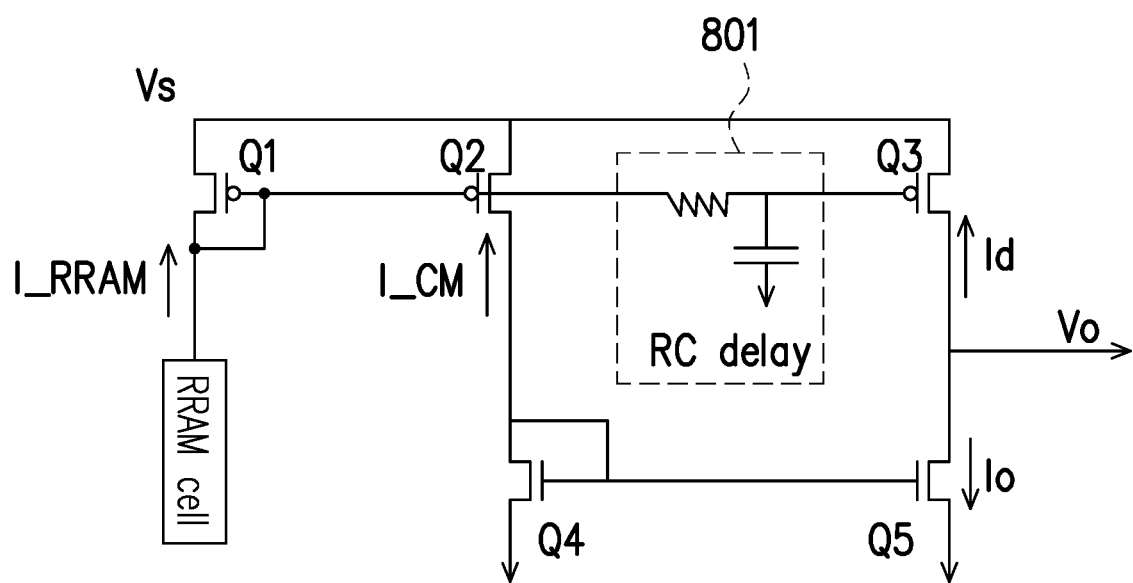
FIG. 8 illustrates a testing apparatus for testing a RRAM cell in accordance with a first exemplary embodiments of the disclosure.
Figure 9:
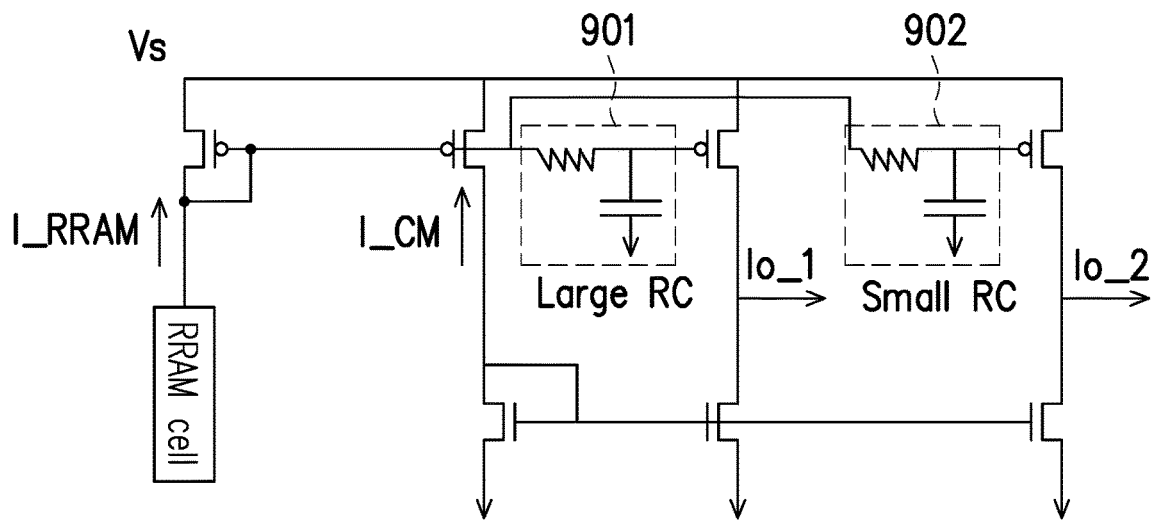
FIG. 9 illustrates a testing apparatus for testing a RRAM cell in accordance with a second exemplary embodiments of the disclosure.
Figure 10:
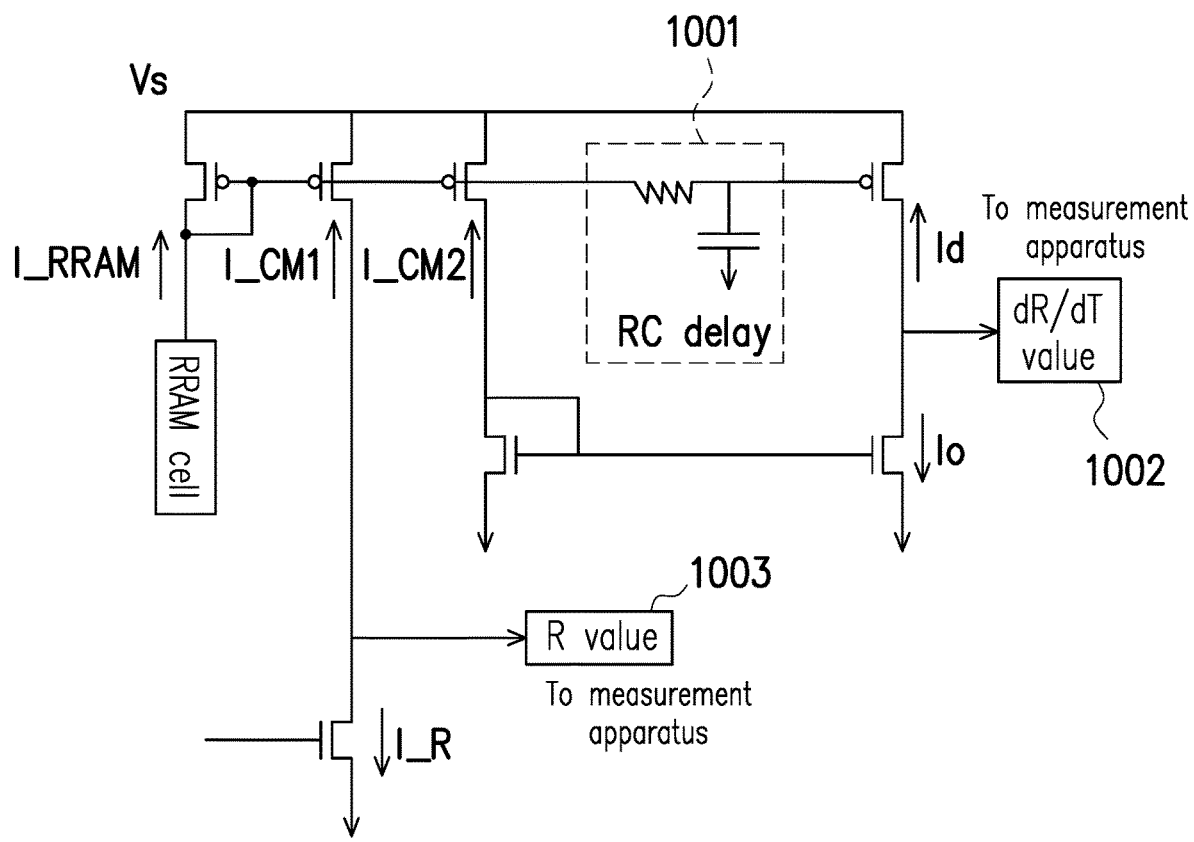
FIG. 10 illustrates a testing apparatus for testing a RRAM cell in accordance with a third exemplary embodiments of the disclosure.

FIG. 8~FIG. 10 illustrates exemplary embodiments of an electronic device which performs verifying an operation of a cell of a RRAM. Refer to FIG. 6, The electronic device may include multiple current mirror circuits which mirror I_RRAM which is the current coming out of the RRAM cell. In response to the write bias voltage being applied, the I_RRAM current would be drawn from the RRAM cell. The Q1 transistor and the Q2 transistor forms a current mirror circuit as the I_CM current would match the I_RRAM current. As the Q4 transistor and the Q5 transistor form another current mirror circuit, the current Io would mirror the I_CM current. Thus, by measuring the Io current, the resistance of RRAM cell could be known. Also, the rate of change of the resistance of the RRAM cell could be provided by the RC delay circuit 601. Since Q1 transistor and the Q3 transistor forms another current mirror circuit with a series capacitor serially connected between the gates of the Q1 transistor and the Q3 transistor while an inductor is situated between the gates of the Q1 transistor and the Q3 transistor in shunt, the rate of change of the resistance of the RRAM could be determined based on the value of the Id current (e.g. first output current). If the Id current increases, then the rate of change of the resistance of the RRAM is positive; whereas if the Id current decreases, then the rate of change of the resistance of the RRAM is negative. It is worth noting that since Io contains no delay, the resistance of the RRAM cell could be measured before the rate of change of the resistance of the RRAM cell could be measured.

Refer to FIG. 9, for this exemplary embodiment, the Q1 transistor and Q3 transistor forms a first current mirror circuit, the Q1 transistor and Q4 transistor form a second current mirror circuit, and Q1 transistor and the Q2 transistor form a third current mirror circuit. The first current mirror circuit contains a first RC delay circuit 901 connected between the gates of the Q1 transistor and the Q3 transistor, and the second current mirror contains a second RC delay circuit 902 connected between the gates of the Q1 transistor and the Q4 transistor. One of the first current mirror circuit and the second current mirror circuit could be an optional element. Assuming that the capacitor of the first RC delay circuit 901 has a large capacitance value than the capacitor of the second RC delay circuit 902, then the first RC delay circuit would allow a detection for a faster rate of change of the resistance then the second RC delay circuit. In other words, the second RC delay circuit 902 having a larger capacitance value would allow a detection of fast changing resistance value of the RRAM cell whereas the first RC delay circuit 901 having a smaller capacitance value would allow a detection of a slower change or unresponsive resistance value. The third current mirror would detect the resistance value of the RRAM cell as the I_CM current mirrors the current coming out of the RRAM cell.

Refer to FIG. 10, for this exemplary embodiment, the electronic device includes multiple current mirror circuits which mirror I_RRAM which is the current coming out of the RRAM cell. In response to the write bias voltage being applied, the I_RRAM current would be drawn from the RRAM cell. The I_CM1 current would match the I_RRAM current. The I_CM1 current would be equivalent to the I_R current which may allowed the resistance value of the RRAM cell to be measured by a measuring circuit 1003. The I_CM2 current would match the I_RRAM current. The I_CM2 current would be equivalent to the I_o current which may allowed the resistance value of the RRAM cell to be measured by a measuring circuit 1002. The rate of change of the resistance of the RRAM could be determined based on the value of the Id current which mirrors the I_RRAM current with a RC delay circuit 1001 connected in between. If the Id current increases, then the rate of change of the resistance of the RRAM is positive; whereas if the Id current decreases, then the rate of change of the resistance of the RRAM is negative.

In view of the aforementioned descriptions, the present disclosure is suitable for being used to test a RRAM cell and is able to provide information regarding the rate of change of the resistance of a RRAM cell in addition to just the resistance value so that the testing apparatus would be able to more accurately determine whether a RRAM cell has passed the test. Moreover, the situation of an unnecessary overwrite could be avoided and writing time could be saved.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of verifying an operation of a resistive random access memory (RRAM), the method comprising:
   performing a first write operation by applying a first write voltage on a cell of the RRAM;
   measuring a first resistance and a first rate of change of the resistance of the cell;
   detecting whether the first rate of change of the resistance is below a negative change of resistance threshold;
   detecting whether the first resistance is below a target resistance value in response to having detected that the first rate of change of the resistance is below the negative change of resistance threshold; and
   having determined the cell is valid in response to having detected the first resistance dropping below the target resistance value.

2. The method of claim 1, further comprising:
   having determined that the cell as failed in response to not having detected the first resistance dropping below the target resistance value.

3. The method of claim 2, further comprising:
   applying a second write voltage which is a reverse of the first write voltage in response to having determined that the cell has failed.

4. The method of claim 3 further comprising:
   measuring a second resistance and a second rate of change of the resistance of the cell;
   detecting whether the second rate of change of the resistance is below the negative change of resistance threshold;
   detecting whether the second resistance is below the target resistance value in response to having detected that the second rate of change of the resistance is below the negative change of resistance threshold; and
   having determined that the cell as failed in response to not having detected the second resistance dropping below the target resistance value.

5. The method of claim 1, wherein performing the first write operation comprising:
   detecting whether a write current drawn by the cell of the RRAM has changed in response to applying a first bias voltage to the cell of the RRAM; and
   increasing the first write voltage in response to not detecting the write current of the cell having been changed.

6. The method of claim 5, wherein measuring the first resistance of the cell and the first rate of change of the resistance of the cell further comprising:
   measuring the first resistance of the cell and the first rate of change of the resistance of the cell by measuring the write current of the cell and a change of the write current in response to applying the first write voltage.

7. The method of claim 1, wherein measuring the first rate of change is performed by a first current mirror circuit which is connected to a first resistor-capacitor (RC) filter having a first delay.

8. The method of claim 7, wherein measuring the first rate of change comprising:
   detecting a first output current of the first current mirror;
   the rate of change is positive if the first output current increases; and
   the rate of change is negative if the first output current decreases.

9. The method of claim 7, wherein measuring the first rate of change is performed by a second current mirror circuit which is connected to a second resistor-capacitor (RC) filter having a second delay which has a larger capacitive value for a longer delay than the first delay.

10. The method of claim 1, wherein measuring the first resistance of the cell and measuring the first rate of change of the resistance of the cell are performed by measuring a second output current of a third current mirror circuit which is connected to the cell of the RRAM.

11. An electronic device comprising:
    a controller circuit configured to:
    perform a first write operation by applying a first write voltage on a cell of e RRAM;
    measure a first resistance and a first rate of change of the resistance of the cell;
    detect whether the first rate of change of the resistance has decreased below a negative change of resistance threshold;
    detect whether the first resistance is below a target resistance value in response to having detected that the first rate of change of the resistance is below the negative change of resistance threshold; and have determined that the cell is valid in response to having detected the first resistance dropping below the target resistance value.

12. The apparatus of claim 11, wherein the controller circuit is further configured to:
   determine that the cell has failed in response to not having detected the first resistance dropping below the target resistance value.

13. The apparatus of claim 12, wherein the controller circuit is further configured to:
   apply a second write voltage which is a reverse of the first write voltage in response to having determined that the cell has failed.

14. The apparatus of claim 13, wherein the controller circuit is further configured to:
   measure a second resistance and a second rate of change of the resistance of the cell;
   detect whether the second rate of change of the resistance is below the negative change of resistance threshold;
   detect whether the second resistance is below the target resistance value in response to having detected that the second rate of change of the resistance is below the negative change of resistance threshold; and
   have determined that the cell as failed in response to not having detected the second resistance dropping below the target resistance value.

15. The apparatus of claim 11, wherein the apparatus is configured to performing the first write operation comprising:
   detect whether a write current drawn by the cell of the RRAM has changed in response to applying a first bias voltage to the cell of the RRAM; and
   increase the first write voltage in response to not detecting the write current of the cell having been changed.

16. The apparatus of claim 15, wherein the controller circuit is configured to measure the first resistance of the cell and the rate of change of the resistance of the cell comprising:
   measuring the first resistance of the cell and the first rate of change of the resistance of the cell by measuring the write current of the cell and a change of the write current in response to applying the first write voltage.

17. The apparatus of claim 11, wherein measuring the first rate of change is performed by the controller circuit connected to a first current mirror circuit which is connected to a first resistor-capacitor (RC) filter having a first delay.

18. The apparatus of claim 17, wherein the apparatus is configured to measure the first rate of change comprising:
   detect a first output current of the first current mirror;
   the rate of change is positive if the first output current increases; and
   the rate of change is negative if the first output current decreases.

19. The apparatus of claim 17, wherein measuring the first rate of change is performed by the controller circuit connected to a second current mirror circuit which is connected to a second resistor-capacitor (RC) filter having a second delay which has a larger capacitive value for a longer delay than the first delay.

20. The apparatus of claim 11, wherein measuring the first resistance of the cell and measuring the first rate of change of the resistance of the cell are performed by the controller circuit by measuring a second output current of a third current mirror circuit which is connected to the cell of the RRAM.

* * * * *